United States Patent
Nakai

Patent Number: 5,160,786
Date of Patent: Nov. 3, 1992

[54] RESIN MATERIAL FOR INSERTING LEAD FRAME AND MOLDED COMPONENT THEREOF

[75] Inventor: Mikio Nakai, Shizuoka, Japan

[73] Assignee: Polyplastics Co. Ltd., Osaka, Japan

[21] Appl. No.: 630,197

[22] Filed: Dec. 19, 1990

[30] Foreign Application Priority Data

Dec. 27, 1989 [JP] Japan ................... 1-344686

[51] Int. Cl.$^5$ .................... B32B 5/16; B32B 15/08
[52] U.S. Cl. ..................... 428/323; 428/324; 428/325; 428/461; 524/500; 525/64; 525/189; 525/537
[58] Field of Search ............... 428/461, 323, 324, 325; 524/500; 525/64, 189, 537

[56] References Cited

U.S. PATENT DOCUMENTS 4,748,169  5/1988  Izutsu et al. .................... 524/500

FOREIGN PATENT DOCUMENTS 59-207921  11/1984  Japan .

*Primary Examiner*—Thomas J. Herbert, Jr.
*Attorney, Agent, or Firm*—Depaoli & O'Brien

[57] ABSTRACT

A resin material for inserting a lead frame comprises:
(A) 100 parts by weight of a polyarylene sulfide resin,
(B) 0.1 to 30 parts by weight of an α-olefin copolymer graft-copolymerized with an unsaturated carboxylic acid or its anhydride, and
(C) 10 to 300 parts by weight of a fibrous filler, a nonfibrous inorganic filler or a mixture thereof.

The grafted unsaturated carboxylic acid such as maleic anhydride is essential, in comparison with olefin copolymers, preferably in an amount of 1 to 5 percent. The olefin copolymer includes that of ethylene and ethyl acrylate. The addition of (B) effectively works to improve adhesion between the lead frame and the polyarylene sulfide composition, because it does not decompose and give a gas during molding. Heat resistance and the molding performance does not change. An example comprises PPS, a copolymer of ethylene and ethyl acrylate, grafted with 3.0% of maleic anhydride, glass fiber and glass beads. It is tested whether or not ink can penetrate into a clearance between the resin and the lead frame.

9 Claims, 1 Drawing Sheet

RESIN MATERIAL FOR INSERTING LEAD FRAME AND MOLDED COMPONENT THEREOF

BACKGROUND OF THE INVENTION

The present invention relates to a resin material for inserting therein a lead frame. More particularly, the present invention is concerned with a resin material for inserting therein a lead frame and which resin exhibits an improved adhesion to the lead frame and has excellent heat resistance, moldability and other general properties. The invention is further concerned with a molded component comprising the above-mentioned resin material and a lead frame inserted therein.

As a method of mounting electronic components on a printed board, recently, a surface packaging technology using an infrared oven, which can realize a higher packaging density, is being widely used in place of the method wherein the terminal of an electronic component is passed through a hole of a printed board and then soldered to the rear of the board. In accordance with this trend, plastic packages for electronic components are usually required to have a high temperature of resistance up to which temperature the resistance to soldering heat is ensured. Moreover, the solvent used as a cleaning liquid for electronic components is usually a strong acid or a strong alkali, which makes it necessary for the printed board to have a solvent resistance sufficient to resist the solvent during the cleaning of electronic components. With respect to these requirements, polyarylene sulfide resin is the most suitable material as a plastic package for electronic components. However, polyarylene sulfide resin has a drawback inasmuch as the adhesion of polyarylene sulfide to a lead frame is poor. Accordingly, cleaning liquid penetrates into gaps between the lead frame and the plastic during the cleaning of electronic components and contaminates contacts. To cope with this drawback, it is a common practice in the art to take measures, such as to apply a primer or an adhesive to the lead frame prior to molding or to use an epoxy resin having a desirable adhesion to metal for potting at the root of the lead frame protruding from the package after molding.

However, such measures complicate the process and result in extreme cost increases. Therefore, a resin material having excellent adhesion to a lead frame has been desired in the art.

SUMMARY OF THE INVENTION

It has now been found that a composition comprising a polyarylene sulfide resin as a principal component and, blended therewith, an α-olefin copolymer graft-copolymerized with an unsaturated carboxylic acid or its anhydride and an inorganic filler has excellent heat stability, generates no significant decomposition gas or evaporating gas at temperatures employed for extruding and molding the polyarylene sulfide resin, and exhibits excellent adhesion to a lead frame without suffering from a lowering in the mechanical properties.

DETAILED DESCRIPTION OF THE INVENTION

Figure 1:
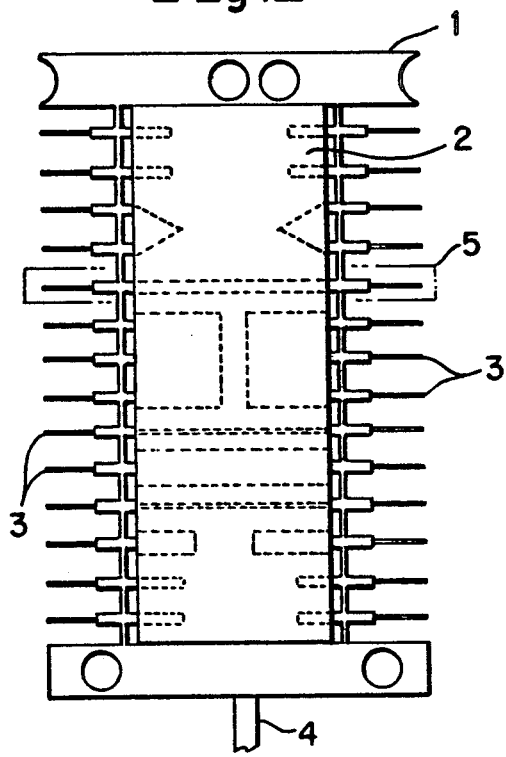
FIG. 1 is a plan view of one embodiment of the molded component having a lead frame inserted in a resin according to the present invention.
Figure 2:
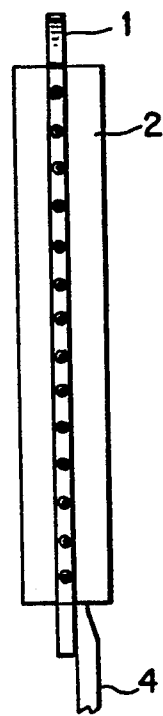
FIG. 2 is a side view of the molded component of FIG. 1.
Figure 3:
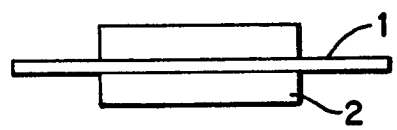
FIG. 3 is an end view of the molded component of FIG. 1.

The present invention provides a resin material for inserting a lead frame, which comprises:

(A) 100 parts by weight of a polyarylene sulfide resin, (B) 0.1 to 30 parts by weight of an α-olefin copolymer graft-copolymerized with an unsaturated carboxylic acid or its anhydride, and (C) 10 to 300 parts by weight of a fibrous filler, a nonfibrous inorganic filler or a mixture thereof; and a molded component comprising the above-described resin material and a lead frame inserted therein.

The base resin as component (A) of the resin material of the present invention is a polyarylene sulfide resin composed of principal recurring units of the formula $-(Ar-S)-$ wherein Ar is an arylene group.

Examples of the arylene group (—Ar—) include:

a p-phenylene group 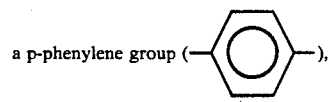

a m-phenylene group 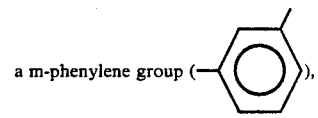

an o-phenylene group 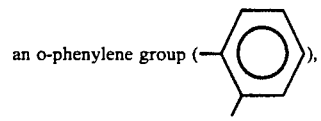

a substituted phenylene group 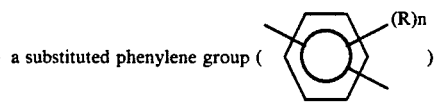

wherein R represents an alkyl group preferably having 1 to 6 carbon atoms or a phenyl group and n is an integer of 1 to 4, a p,p'-phenylenesulfone group

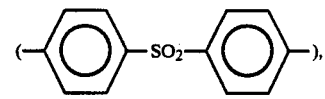

a p,p'-biphenylene group

a p,p'-diphenylene ether group

-continued

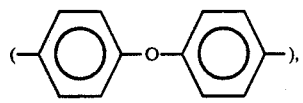

a p,p'-diphenylene carbonyl group

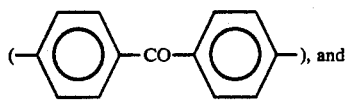

a naphthalene group

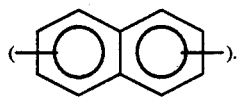

The polyarylene sulfide resin may be a polymer comprising only one type of recurring unit selected from the arylene sulfide groups composed of the above-described arylene groups, namely, a homopolymer. In some cases, it is preferably a copolymer comprising different types of recurring units described above from the viewpoint of workability of the final composition.

The homopolymer is particularly preferably a poly-p-phenylene sulfide (hereinafter referred to as "PPS") comprising a p-phenylene sulfide group as an arylene group and having a substantially linear molecular structure.

The copolymer is preferably one comprising the above-described arylene group or a m-phenylene sulfide group in an amount of from 5 to 50 mol%, especially from 10 to 25 mol%.

In this case, a copolymer comprising recurring units in a block form (for example, a copolymer described in Japanese Patent Laid-Open No. 14228/1986) is more favorable than a copolymer comprising recurring units in a random form because the former has higher heat resistance and mechanical properties while retaining substantially equal workability.

The polyarylene sulfide resin to be used as component (A) in the present invention is not particularly limited but includes those subjected to oxidative cross-linking or thermal cross-linking. However, a substantially linear polymer having a low degree of cross-linking prepared by the polycondensation of a bifunctional monomer is preferred.

Especially, a substantially linear polymer having a melt viscosity of $1 \times 10$ to $5 \times 10^5$ P, preferably 50 to $5 \times 10^4$ P, more favorably 100 to $5 \times 10^4$ P, as measured under conditions of a temperature of 310° C. and a shear rate of 5/sec is suitable. When the melt viscosity is lower than 10 P, the fluidity is so high that melt molding is difficult. In this case, even if a molded article is obtained, the mechanical properties of the article are disadvantageously low. On the other hand, when the melt viscosity is higher than $5 \times 10^5$ P, the fluidity is so poor that melt molding is difficult.

The α-olefin copolymer to be added as component (B) in the present invention must have an unsaturated carboxylic acid or its anhydride grafted thereonto. When an α-olefin copolymer not having an unsaturated carboxylic acid or its anhydride grafted thereonto is added, the adhesion of the resin to a lead frame cannot be improved in the least. A copolymer comprising maleic anhydride as the unsaturated carboxylic acid or its anhydride and having a degree of grafting of 1.0 to 5.0% is particularly preferred. When the degree of grafting is lower than 1.0%, the adhesion to a lead frame cannot be sufficiently improved. On the other hand, when it is higher than 5.0%, a large amount of a decomposition gas or evaporating gas occurs disadvantageously during the extrusion or molding. From the viewpoint of preventing the occurrence of the decomposition gas or evaporating gas, it is preferred that a copolymer comprising ethylene/ethyl acrylate as a principal chain structure be used as the α-olefin copolymer. The amount of addition of component (B) is preferably 0.1 to 30 parts by weight, especially preferably 5.0 to 20 parts by weight based on 100 parts by weight of the polyarylene sulfide resin (A). When the amount of component (B) is too small, the adhesion to a lead frame is poor. On the other hand, when it is too large, the mechanical properties and heat resistance are insufficient.

The filler to be used as component (C) in the present invention is an essential component for lowering the molding shrinkage ratio and the coefficient of linear expansion and for improving the adhesion to a lead frame. The filler may be fibrous or nonfibrous (a particulate or flaky form).

Of the above fillers, particulate and flaky fillers are preferred because they are highly effective in suppressing the anisotropy of the molding shrinkage ratio and the coefficient of linear expansion. Examples of the filler include silicates, such as silica, quartz powder, glass beads, glass powder, calcium silicate, aluminum silicate, kaolin, talc, clay, diatomaceous earth and wollastonite, metal oxides, such as iron oxide, titanium oxide, zinc oxide and alumina, metal carbonates, such as calcium carbonate and magnesium carbonate, metal sulfates, such as calcium sulfate and barium sulfate, silicon carbide, silicon nitride, boron nitride and various metal powders. Of these, silica, talc and glass beads are particularly preferred.

Mica, glass flake, etc. are preferred as the a finely divided mica powder. With respect to the grain size of the flaky filler, the smaller the better. It is generally desired that the average grain size be not larger than 200 μm.

The fibrous filler is incorporated in order to improve the properties, such as mechanical strengths and heat resistance. Examples of the fibrous filler include inorganic fibrous materials, such as glass fiber, asbestos fiber, silica fiber, silica/alumina fiber, zirconia fiber, boron nitride fiber, silicon nitride fiber, boron fiber and potassium titanate fiber. In addition, it is also possible to use an organic fibrous material having a high melting temperature, such as polyamide, fluororesin and acrylic resin.

A combination of a glass fiber having an average fiber length of from 30 to 500 μm with a particulate or flaky filler is particularly preferred. A combination of at least one member selected from a finely divided mica powder, talc and glass beads with glass fiber is particularly effective in improving the adhesion to a lead frame.

If necessary, these fillers are used in combination with a binder or a surface treatment. Examples of the binder and surface treatment include functional compounds, such as epoxy compounds, isocyanate compounds, silane compounds and titanate compounds. These compounds may be used for the preliminary surface treatment or binding treatment of the filler. Alternatively, they may be added during the preparation of the material. In particular, organic silanes, especially an aminoalkoxysilane, a mercaptoalkoxysilane and a vinylalkoxysilane are suitable.

The amount of the inorganic filler as component (C) is 10 to 300 parts by weight, preferably 50 to 200 parts by weight based on 100 parts by weight of polyarylene sulfide resin(a). When the amount is too small, the molding shrinkage ratio and the coefficient of linear expansion are too large and the adhesion to a lead frame cannot be sufficiently improved. On the other hand, when it is too large, the moldability is poor and the mechanical strengths of the final molded article are insufficient.

Further, the composition of the present invention may suitably contain known materials which are generally added to ordinary thermoplastic and thermosetting resins, i.e., stabilizers such as antioxidants and ultraviolet absorbers, antistatic agents, flame retardants, colorants such as dyes and pigments, lubricants and crystallization accelerators according to the desired performance.

The resin material for inserting a lead frame according to the present invention can be prepared by employing the equipment and method generally used for the preparation of a synthetic resin composition. Specifically, necessary components may be mixed with each other and kneaded and extruded with a single-screw or a twin-screw extruder to prepare a molding pellet. Alternatively, part of the necessary components may be mixed as a master batch and melt extruded. Further, it is possible to employ a method which comprises pulverizing part or the whole of the polyarylene sulfide resin for the purpose of improving the dispersion, blending the components with each other and melt-extruding the mixture.

The molded component having a lead frame inserted therein according to the present invention can be obtained by molding the above-described resin material according to the conventional metal insert injection molding method. That is, the shaped component can be produced at high efficiency by placing a lead frame in a predetermired position within a mold and performing injection molding.

Referring to the drawings, it can be seen in FIG. 1 that the lead frame 1, typically made of copper, is encapsulated in resin portion 2. Reference numeral 3 indicates the lead frame terminals while reference numeral 4 refers to the gate from the mold for insertion of the resin therein. Reference numeral 5 indicates the portion of the insert molded lead frame shown in FIG. 4 which illustrates the ink penetration test as set forth in the examples.

The present invention will now be described in more detail with reference to the following examples, which however should not be construed as limiting the scope of the present invention.

EXAMPLES 1 TO 13

Figure 4:
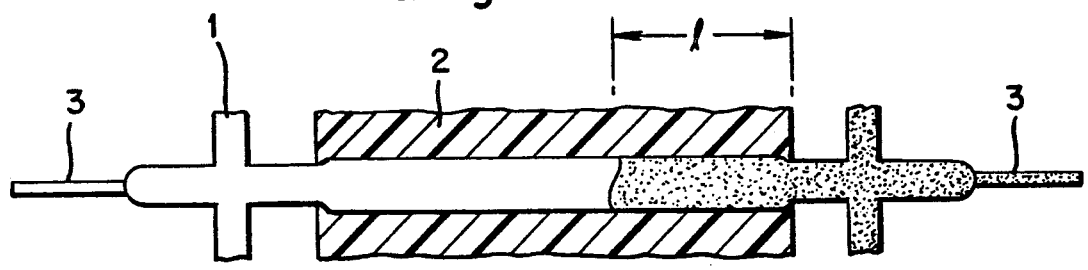
FIG. 4 is a fragmentary enlarged view of FIG. 1 showing the portion of measurement in an ink penetration test as set forth in the examples.

The materials listed in Table 1 were added in amounts specified in Table 1 to a polyarylene sulfide resin, and blended by means of a blender for 2 minutes. The blend was melt-kneaded by means of an extruder at a cylinder temperature of 310° C. and molded into resin material pellets. The pellets were injection-molded by means of an injection molding machine at a cylinder temperature of 320° C. by making use of a mold having a lead frame placed therein, thereby preparing a test piece having a lead frame inserted therein as shown in FIG. 1. One terminal side of the test piece was immersed in a specific fluorescent ink (PEP fluorescent penetrant F-6A-SP; a product of Eishin Co., Ltd.) to the half length of the test piece at room temperature for 15 minutes. The adhesion of the resin to the metallic lead frame was evaluated by the distance (l) of ink penetration as shown in FIG. 4 between the resin and the lead frame due to capillary action. The maximum measurable ink penetration distance was 14 mm.

The results are given in Table 1 wherein the flexural properties of a separately prepared standard test piece are also given.

COMPARATIVE EXAMPLES 1 TO 9

The same polyarylene sulfide resin as that of the Examples was prepared, and the materials listed in Table 2 were added thereto in amounts specified in Table 2, thereby producing a resin material (pellets). This was evaluated in the same manner as that of the Examples. The results are given in Table 2.

TABLE 1

|  | Ex. 1 | Ex. 2 | Ex. 3 | Ex. 4 | Ex. 5 | Ex. 6 | Ex. 7 |
|---|---|---|---|---|---|---|---|
| Composition |  |  |  |  |  |  |  |
| (A) PPS (pts. wt.) | 100 | 100 | 100 | 100 | 100 | 100 | 100 |
| (C) glass fiber (pts. wt.) | 85 | 85 | 55 | 85 | 85 | 85 | 55 |
| (C) glass bead (pts. wt.) | 85 | 85 | 85 | — | — | — | — |
| (C) talc (pts. wt.) | — | — | — | — | — | — | — |
| (C) mica powder (pts. wt.) | — | — | — | 85 | 85 | 85 | 55 |
| (B) note (1) (pts. wt.) | 15 | 8 | 11 | 15 | 5 | 1 | 11 |
| Properties |  |  |  |  |  |  |  |
| bending strength (kg/cm$^2$) | 1861 | 1901 | 1686 | 1896 | 1988 | 1982 | 1890 |
| bending modulus of elasticity (kg/cm$^2$) | $14.8 \times 10^4$ | $16.2 \times 10^4$ | $11.4 \times 10^4$ | $16.8 \times 10^4$ | $17.0 \times 10^4$ | $17.4 \times 10^4$ | $15.5 \times 10^4$ |
| deflection in bending (%) | 1.26 | 1.30 | 1.31 | 1.21 | 1.21 | 1.21 | 1.25 |
| ink penetration distance (mm) | 4.1 | 4.9 | 4.4 | 1.4 | 5.7 | 7.5 | 1.7 |

|  | Ex. 8 | Ex. 9 | Ex. 10 | Ex. 11 | Ex. 12 | Ex. 13 |
|---|---|---|---|---|---|---|
| Composition |  |  |  |  |  |  |
| (A) PPS (pts. wt.) | 100 | 100 | 100 | 100 | 100 | 100 |
| (C) glass fiber (pts. wt.) | 85 | 55 | 170 | — | — | — |
| (C) glass bead (pts. wt.) | — | — | — | 170 | — | — |
| (C) talc (pts. wt.) | 85 | 55 | — | — | 170 | — |
| (C) mica powder (pts. wt.) | — | — | — | — | — | 170 |
| (B) note (1) (pts. wt.) | 15 | 11 | 15 | 15 | 15 | 15 |
| Properties |  |  |  |  |  |  |
| bending strength (kg/cm$^2$) | 1710 | 1661 | 2018 | 1381 | 1303 | 1411 |

TABLE 1-continued

| | | | | | | |
|---|---|---|---|---|---|---|
| bending modulus of elasticity (kg/cm$^2$) | $15.0 \times 10^4$ | $14.8 \times 10^4$ | $17.1 \times 10^4$ | $8.16 \times 10^4$ | $7.46 \times 10^4$ | $9.84 \times 10^4$ |
| deflection in bending (%) | 1.11 | 1.18 | 1.32 | 1.05 | 1.07 | 1.11 |
| ink penetration distance (mm) | 2.7 | 3.1 | 6.5 | 5.9 | 5.6 | 5.1 |

Note: (1) maleic anhydride-grafted copolymer of ethylene/ethyl acrylate (degree of grafting: 3.0%)

TABLE 2

| | Comp. Ex. 1 | Comp. Ex. 2 | Comp. Ex. 3 | Comp. Ex. 4 | Comp. Ex. 5 |
|---|---|---|---|---|---|
| Composition | | | | | |
| (A) PPS (pts. wt.) | 100 | 100 | 100 | 100 | 100 |
| (C) glass fiber (pts. wt.) | 170 | 85 | 55 | 85 | 55 |
| (C) glass bead (pts. wt.) | — | 85 | 55 | — | — |
| (C) talc (pts. wt.) | — | — | — | 85 | 55 |
| (C) mica powder (pts. wt.) | — | — | — | — | — |
| (B) note (2) (pts. wt.) | — | — | — | — | — |
| (B) note (3) (pts. wt.) | — | — | — | — | — |
| Properties | | | | | |
| bending strength (kg/cm$^2$) | 2111 | 1933 | 1751 | 1798 | 1666 |
| bending modulus of elasticity (kg/cm$^2$) | $17.7 \times 10^4$ | $15.5 \times 10^4$ | $12.1 \times 10^4$ | $15.5 \times 10^4$ | $15.1 \times 10^4$ |
| deflection in bending (%) | 1.38 | 1.25 | 1.31 | 1.18 | 1.20 |
| ink penetration distance (mm) | >14.0 | >14.0 | >14.0 | >14.0 | >14.0 |

| | Comp. Ex. 6 | Comp. Ex. 7 | Comp. Ex. 8 | Comp. Ex. 9 |
|---|---|---|---|---|
| Composition | | | | |
| (A) PPS (pts. wt.) | 100 | 100 | 100 | 100 |
| (C) glass fiber (pts. wt.) | 85 | 55 | 55 | 55 |
| (C) glass bead (pts. wt.) | — | — | — | — |
| (C) talc (pts. wt.) | — | — | — | — |
| (C) mica powder (pts. wt.) | 85 | 55 | 55 | 55 |
| (B) note (2) (pts. wt.) | — | — | 11 | — |
| (B) note (3) (pts. wt.) | — | — | — | 11 |
| Properties | | | | |
| bending strength (kg/cm$^2$) | 1997 | 1991 | 1918 | 1922 |
| bending modulus of elasticity (kg/cm$^2$) | $17.5 \times 10^4$ | $16.5 \times 10^4$ | $15.8 \times 10^4$ | $16.2 \times 10^4$ |
| deflection in bending (%) | 1.21 | 1.21 | 1.16 | 1.18 |
| ink penetration distance (mm) | >14.0 | >14.0 | >14.0 | 12.0 |

Note:
(2) ethylene/ethyl acrylate copolymer (degree of grafting: 0%)
(3) ethylene/ethyl acrylate/maleic anhydride copolymer (degree of grafting: 0%)

I claim:

1. A molded component comprising a resin material and a lead frame inserted therein, said resin material comprising:
   (A) 100 parts by weight of a polyarylene sulfide resin,
   (B) 0.1 to 30 parts by weight of an α-olefin copolymer graft-copolymerized with an unsaturated carboxylic acid or its anhydride, and
   (C) 10 to 300 parts by weight of a fibrous filler, a nonfibrous inorganic filler or a mixture thereof.

2. The molded component of claim 1, wherein the unsaturated carboxylic acid or its anhydride constituting component (B) is maleic anhydride.

3. The molded component of claim 1, wherein the α-olefin copolymer constituting component (B) is an ethylene/ethyl acrylate resin.

4. The molded component of claims 1, 2 or 3, wherein component (C) comprises a mixture of at least one powdery filler selected from the group consisting of mica, talc, glass flake and glass beads with a glass fiber.

5. The molded component of claims 1, 2 or 3 wherein component C comprises a mixture of a fibrous filler with a nonfibrous inorganic filler.

6. A resin material for inserting a lead frame, which consists essentially of:
   (A) 100 parts by weight of a polyarylene sulfide resin,
   (B) 0.1 to 30 parts by weight of an α-olefin copolymer graft-copolymerized with an unsaturated carboxylic acid or its anhydride, and
   (C) 10 to 300 parts by weight of a filler comprising a mixture of a fibrous filler with a nonfibrous inorganic filler.

7. A resin composition for inserting a lead frame according to claim 6, wherein the unsaturated carboxylic acid or its anhydride constituting component (B) is maleic anhydride.

8. A resin material for inserting a lead frame according to claim 6, wherein the α-olefin copolymer constituting component (B) is an ethylene/ethyl acrylate resin.

9. A resin material for inserting a lead frame according to any of claims 6, 7 or 8, wherein component (C) comprises a mixture of at least one powdery filler selected from the group consisting of mica, talc, glass flake and glass beads with a glass fiber.

* * * * *